United States Patent
Takada

(10) Patent No.: US 11,961,948 B2
(45) Date of Patent: Apr. 16, 2024

(54) OPTICAL SEMICONDUCTOR DEVICE

(71) Applicant: SUMITOMO ELECTRIC DEVICE INNOVATIONS, INC., Yokohama (JP)

(72) Inventor: Kan Takada, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 0 days.

(21) Appl. No.: 17/019,443

(22) Filed: Sep. 14, 2020

(65) Prior Publication Data

US 2021/0083158 A1 Mar. 18, 2021

(30) Foreign Application Priority Data

Sep. 13, 2019 (JP) .................................. 2019-167674

(51) Int. Cl.
*H01L 33/44* (2010.01)
*H01L 33/00* (2010.01)
*H01L 33/36* (2010.01)
*H01L 33/58* (2010.01)

(52) U.S. Cl.
CPC ............ *H01L 33/58* (2013.01); *H01L 33/005* (2013.01); *H01L 33/36* (2013.01); *H01L 2933/0058* (2013.01)

(58) Field of Classification Search
CPC ........... H01L 2933/0058; H01L 33/005; H01L 33/30; H01L 33/36; H01L 33/44; H01L 33/58

See application file for complete search history.

(56) References Cited

U.S. PATENT DOCUMENTS

| 5,390,205 A | 2/1995 | Mori et al. |
| 2004/0159847 A1* | 8/2004 | Kondo ............... G02F 1/01708 257/94 |
| 2007/0155031 A1 | 7/2007 | Yamazaki et al. |
| 2008/0049805 A1 | 2/2008 | Takiguchi et al. |

(Continued)

FOREIGN PATENT DOCUMENTS

| CN | 106972345 A | 7/2017 |
| JP | H06-291416 A | 10/1994 |

(Continued)

*Primary Examiner* — Matthew C Landau
*Assistant Examiner* — Dmitriy Yemelyanov
(74) *Attorney, Agent, or Firm* — Oliff PLC

(57) ABSTRACT

An optical semiconductor device includes: a mesa that is provided on a surface in a <011> direction of a semiconductor substrate having a (100) plane orientation and being of a first conductivity type, and includes a first cladding layer of the first conductivity type, an active layer, and a second cladding layer of a second conductivity type; a semi-insulating buried layer that buries both sides of the mesa, is provided on the semiconductor substrate, and includes a first region and a second region farther from the mesa than the first region; an insulation film provided on the first and second regions of the buried layer; and an electrode provided on the mesa and the insulation film on the first region; wherein a surface of the first region is at a height equal to or lower than a surface of the mesa, and lowers at farther distances from the mesa.

8 Claims, 5 Drawing Sheets

(56) References Cited

U.S. PATENT DOCUMENTS

| | | |
|---|---|---|
| 2008/0240191 A1* | 10/2008 | Takada .................... H01S 5/227 |
| | | 372/44.01 |
| 2009/0067460 A1 | 3/2009 | Murata |
| 2009/0252190 A1* | 10/2009 | Yoshimura .............. H01S 5/227 |
| | | 372/45.01 |
| 2009/0290611 A1 | 11/2009 | Takiguchi et al. |
| 2017/0207604 A1 | 7/2017 | Watanabe |

FOREIGN PATENT DOCUMENTS

| | | | |
|---|---|---|---|
| JP | H11112100 A | * | 4/1999 |
| JP | H11-186666 A | | 7/1999 |
| JP | 2007-165640 A | | 6/2007 |
| JP | 2009-283822 A | | 12/2009 |
| JP | 2010-271667 A | | 12/2010 |

\* cited by examiner

OPTICAL SEMICONDUCTOR DEVICE

CROSS-REFERENCE TO RELATED APPLICATION

This application is based upon and claims the benefit of priority of the prior Japanese Patent Application No. 2019-167674, filed on Sep. 13, 2019, the entire contents of which are incorporated herein by reference.

BACKGROUND

(i) Technical Field

The present invention relates to an optical semiconductor device and a method of assembling the same.

(ii) Related Art

An optical semiconductor device in which semiconductor layers including an active layer are stacked on a substrate as disclosed in, for example, Japanese Patent Application Publication No. H11-186666. A mesa is formed of the active layer and the like. An electrode for injecting an electric current is provided on the mesa. To reduce the parasitic capacitance to achieve high-speed operation, buried layers are provided on both sides of the mesa.

SUMMARY

To reduce the parasitic capacitance, a buried layer having a sufficient thickness is provided. However, when the buried layer protrudes upward, the electrode may become thin and rupture. And so, the purpose of the present invention is to provide an optical semiconductor device and a method of assembling the same that are capable of inhibiting rupture of the electrode.

According to an aspect of the present invention, there is provided an optical semiconductor device including: a semiconductor substrate having a (100) plane orientation and being of a first conductivity type; a mesa that is provided on a surface in a <011> direction of the semiconductor substrate, and includes a first cladding layer of the first conductivity type, an active layer, and a second cladding layer of a second conductivity type; a semi-insulating buried layer that buries both sides of the mesa, is provided on the semiconductor substrate, and includes a first region and a second region that is arranged farther from the mesa than the first region; an insulation film provided on the first region and the second region of the buried layer; and an electrode provided on the mesa and the insulation film on the first region; wherein a surface of the first region is arranged at a height equal to or lower than that of a surface of the mesa, and lowers at farther distances from the mesa.

According to another aspect of the present invention, there is provided a method of assembling an optical semiconductor device including steps of: forming a first cladding layer of a first conductivity type, an active layer, and a second cladding layer of a second conductivity type in sequence on a semiconductor substrate that has a (100) plane orientation and is of the first conductivity type; providing a first mask on the second cladding layer; forming a mesa in a <011> direction by etching the first cladding layer, the active layer, and the second cladding layer using the first mask; forming a semi-insulating first buried layer on both sides of the mesa; forming a second mask on the mesa and a part of the first buried layer, a width of the second mask being greater than a width of the first mask; forming a second buried layer on the first buried layer using the second mask; forming an insulation film on the first buried layer and the second buried layer; and forming an electrode on the mesa, the first buried layer, and the second buried layer.

DETAILED DESCRIPTION

Figure 1:
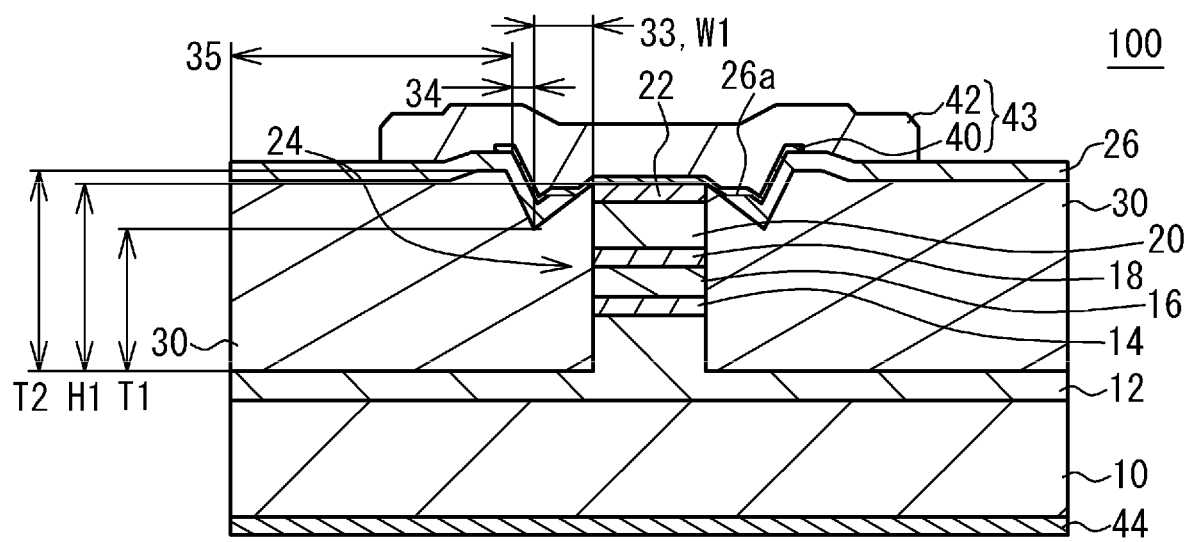
FIG. 1 is a cross-sectional view illustrating an optical semiconductor device in accordance with a first embodiment.

Description of Embodiments of the Present Invention

First, details of embodiments of the present disclosure will be described as listed below.

An embodiment of the present disclosure is (1) an optical semiconductor device including: a semiconductor substrate having a (100) plane orientation and being of a first conductivity type; a mesa that is provided on a surface in a <011> direction of the semiconductor substrate, and includes a first cladding layer of the first conductivity type, an active layer, and a second cladding layer of a second conductivity type; a semi-insulating buried layer that buries both sides of the mesa, is provided on the semiconductor substrate, and includes a first region and a second region that is arranged farther from the mesa than the first region; an insulation film provided on the first region and the second region of the buried layer; and an electrode provided on the mesa and the insulation film on the first region; wherein a surface of the first region is arranged at a height equal to or lower than that of a surface of the mesa, and lowers at farther distances from the mesa.

(2) A thickness of the second region may be greater than a thickness of the first region.

(3) At least a part of an upper surface of the second region may be located higher than the surface of the mesa.

(4) The semi-insulating buried layer may have a third region between the first region and the second region, and an upper surface of the third region may heighten at farther distances from the first region in a direction to the second region.

(5) The electrode may extend from the mesa to the first region and the second region.

(6) The electrode may include an ohmic electrode and a wiring layer provided on the ohmic electrode.

(7) The insulation film may have an opening exposing the upper surface of the mesa, and wherein an end of the opening may be located in the first region.

(8) The buried layer may be formed of indium phosphide.

(9) A method of assembling an optical semiconductor device includes steps of: forming a first cladding layer of a first conductivity type, an active layer, and a second cladding layer of a second conductivity type in sequence on a semiconductor substrate that has a (100) plane orientation and is of the first conductivity type; providing a first mask on the second cladding layer; forming a mesa in a <011> direction by etching the first cladding layer, the active layer, and the second cladding layer using the first mask; forming a semi-insulating first buried layer on both sides of the mesa; forming a second mask on the mesa and a part of the first buried layer, a width of the second mask being greater than a width of the first mask; forming a second buried layer on the first buried layer using the second mask; forming an insulation film on the first buried layer and the second buried layer; and forming an electrode on the mesa, the first buried layer, and the second buried layer.

(10) The forming of the first buried layer may include forming the first buried layer so that the upper surface of the first buried layer is located lower than the upper surface of the mesa, and the forming of the second buried layer may include forming the second buried layer so that the upper surface of the second buried layer is located higher than the upper surface of the mesa.

(11) The step of forming the electrode may include forming an ohmic electrode and forming a wiring layer on the ohmic electrode.

(12) The method may further include steps of: removing the first mask before forming the second mask; and removing the second mask before forming the insulation film.

Details of Embodiments of the Present Invention

The following describes specific examples of an optical semiconductor device and a method of assembling the same in accordance with embodiments of the present invention with reference to drawings. It should be noted that the present invention is not limited to these examples but is shown by the claims, and it is intended that all modifications are included in the equivalents of the claims and the scope of the claims.

First Embodiment (Optical Semiconductor Device)

FIG. 1 is a cross-sectional view illustrating an optical semiconductor device 100 in accordance with a first embodiment. As illustrated in FIG. 1, a cladding layer 12, an optical guide layer 14, an active layer 16, an optical guide layer 18, a cladding layer 20, and a contact layer 22 are stacked in sequence on a substrate 10, and these semiconductor layers form a mesa 24. Buried layers 30 are provided on the upper surface of the cladding layer 12 and on both sides of the mesa 24, and bury the mesa 24.

An insulation film 26 is provided on the upper surfaces of the buried layers 30. The insulation film 26 is formed of an insulating material such as, but not limited to, silicon nitride (SiN) with a thickness of 0.5 µm, and has an opening 26a. The opening 26a has a width larger than the width of the mesa 24, and exposes the upper surface of the mesa 24. An ohmic electrode 40 is provided on the upper surfaces of the mesa 24 and the insulation film 26, and a wiring layer 42 is provided on the ohmic electrode 40 and the insulation film 26. The ohmic electrode 40 and the wiring layer 42 are in contact with each other, and form a p-type electrode 43. An n-type electrode 44 is provided on a bottom surface of the substrate 10. The p-type ohmic electrode 40 is formed of stacked layers of, for example, gold (Au), Zn, and Au, and has a thickness of, for example, 70 nm. The wiring layer 42 is a plated layer formed of, for example, Au, and has a thickness of 3.0 µm. The n-type electrode 44 is formed of a multilayer structure (AuGe/Au/Ti/Pt/Au) of gold germanium, gold, titanium, platinum, and gold, and has a thickness of, for example, 1.0 µm.

The substrate 10 is a semiconductor substrate formed of, for example, n-type indium phosphorus (InP) having a thickness of 100 µm and having a (100) plane orientation. The cladding layer 12 is formed of, for example, n-type InP with a thickness of 1.0 µm. The dopants of the substrate 10 and the cladding layer 12 are, for example, silicon (Si), and the dopant concentration is, for example, $1\times10^{18}$ cm$^{-3}$. The optical guide layers 14 and 18 are formed of, for example, non-doped indium gallium arsenide phosphorus (InGaAsP). The active layer 16 has, for example, a multi quantum well (MQW) structure, includes a plurality of non-doped indium gallium arsenide phosphorus (InGaAsP) layers, and has a thickness of 0.15 µm. The cladding layer 20 is formed of, for example, Zn-doped p-type InP with a thickness of 1.5 µm. The height H1 of the mesa 24 based on the cladding layer 12 is, for example, 3.0 µm. The substrate 10 and the semiconductor layers may be formed of compound semiconductors other than the above compound semiconductors.

The active layer 16 has a gain, and emits a light by injecting an electric current with use of the electrodes 43 and 44. The band of the oscillation wavelength of the optical semiconductor device 100 is, for example, 1.3 to 1.55 µm. The mesa 24 extends in the <011> direction, and the light propagates along the extension direction of the mesa 24.

To reduce current constriction and parasitic capacitance, the buried layers 30 are provided. The buried layers 30 are located on both sides of the mesa 24 in the direction intersecting with the propagation direction of the light (the horizontal direction in FIG. 1). The buried layer 30 is formed of, for example, iron (Fe)-doped semi-insulating InP. The buried layers 30 include regions 33, 34, and 35 at both sides of the mesa 24. The regions 33, 34, and 35 are arranged in this order from the side closer to the mesa 24 to the side farther from the mesa 24. The insulation film 26 covers the regions 33, 34, and 35. The ohmic electrode 40 and the wiring layer 42 are provided on the mesa 24 and the regions 33, 34, and 35.

The region 33 (a first region) is adjacent to the mesa 24. The upper surface of the region 33 is inclined. The upper surface of the region 33 lowers at farther distances from the mesa 24, and connects between the upper surface of the mesa 24 and the region 34. The upper surface of the region 33 does not protrude above the mesa 24, and is located at a position identical to or lower than the position of the upper surface of the mesa 24. The upper surface of the region 34 (a third region) is inclined, and heightens at closer distances to the region 35 from the region 33. At least a part of the upper surface of the region 35 (a second region) is located higher than the upper surface of the mesa 24. That is, the buried layers 30 have recess shapes at both sides of the mesa 24. The width W1 of the region 33 is, for example, 1.0 µm. The thickness T1 of the thinnest part of the region 33 is, for example, 2.6 µm, and is less than the thickness (the height H1) of the mesa 24. The thickness T2 of the thickest part of the region 35 is, for example, 3.2 µm, and is greater than the height H1 of the mesa 24.

(Assembling Method)

Figure 2A:
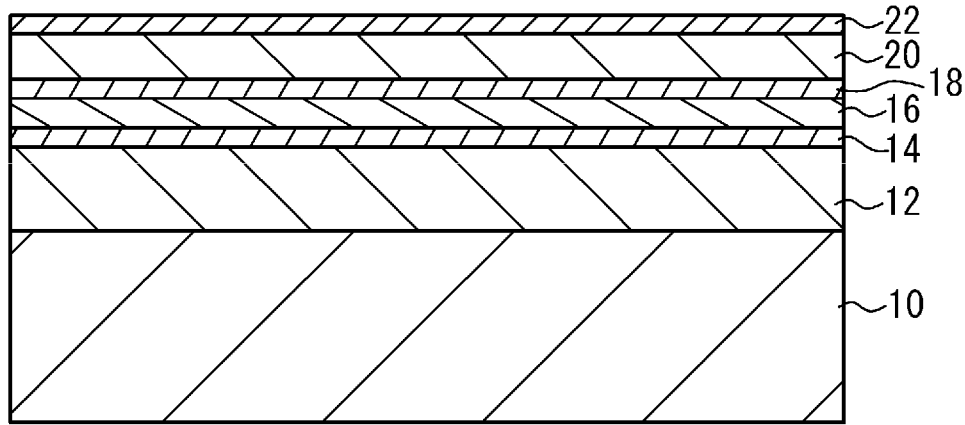
FIG. 2A to FIG. 2C are cross-sectional views illustrating a method of assembling the optical semiconductor device.

FIG. 2A to FIG. 4C are cross-sectional views illustrating a method of assembling the optical semiconductor device 100. As illustrated in FIG. 2A, the cladding layer 12, the optical guide layer 14, the active layer 16, the optical guide layer 18, the cladding layer 20, and the contact layer 22 are epitaxially grown in sequence on the (100) plane of the substrate 10 by, for example, the metal organic chemical vapor deposition method (the MOCVD method).

Figure 2B:
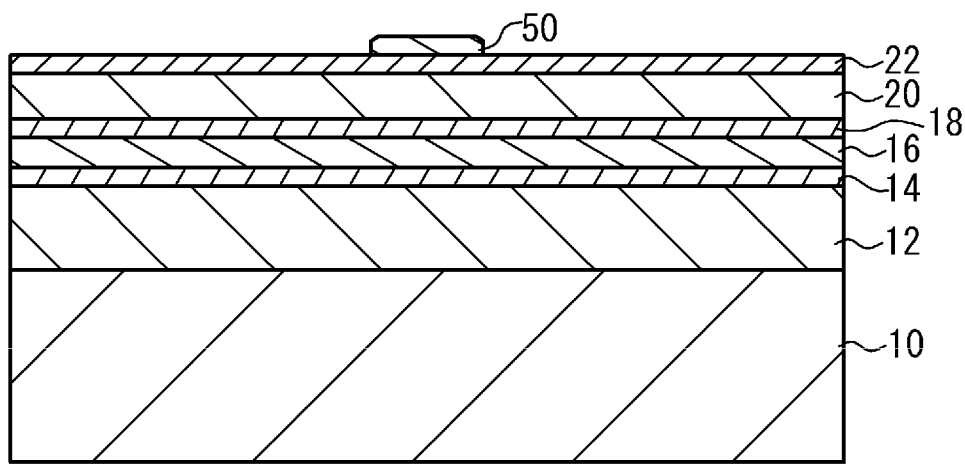
Figure 2C:
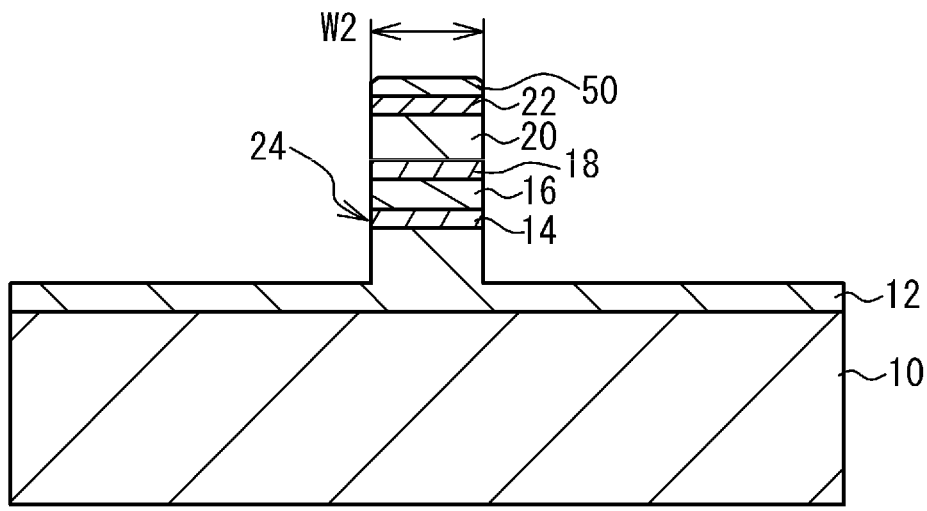

As illustrated in FIG. 2B, a mask 50 (a first mask) of, for example, silicon dioxide ($SiO_2$) is provided on the contact layer 22. The width W2 of the mask 50 is, for example, 2.0 µm, and is equal to the width of the mesa 24. As illustrated in FIG. 2C, dry etching is performed using the mask 50 to form the mesa 24 from the cladding layer 12, the optical guide layer 14, the active layer 16, the optical guide layer 18, the cladding layer 20, and the contact layer 22. A mixed gas of, for example, hydrogen iodide gas and silicon tetrachloride gas is used for dry etching.

Figure 3A:
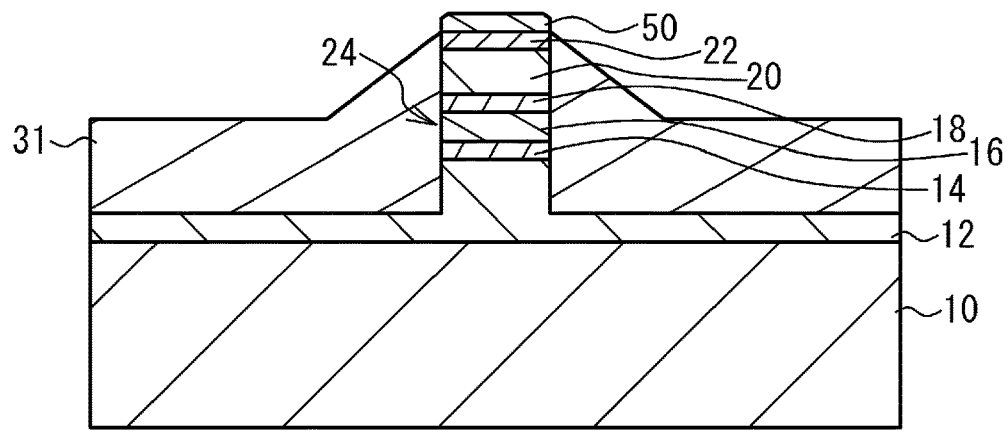
FIG. 3A to FIG. 3C are cross-sectional views illustrating the method of assembling the optical semiconductor device.

As illustrated in FIG. 3A, buried layers 31 (a first buried layer) are epitaxially grown on both sides of the mesa 24 and on the upper surface of the cladding layer 12 by, for example, the MOCVD method. Since the mesa 24 is protected by the mask 50, the buried layer 31 is not grown on the upper surface of the mesa 24. The buried layers 31 are grown so that the upper surface of the buried layer 31 does not protrude above the upper surface of the mesa 24. For example, the growth time and the flow rate of the raw material gas are adjusted, and the growth is stopped when the thickness of at least a part of the buried layer 31 becomes approximately equal to the height of the mesa 24. The upper surface of the buried layer 31 after the growth is inclined downward as the distance from the mesa 24 increases.

Figure 3B:
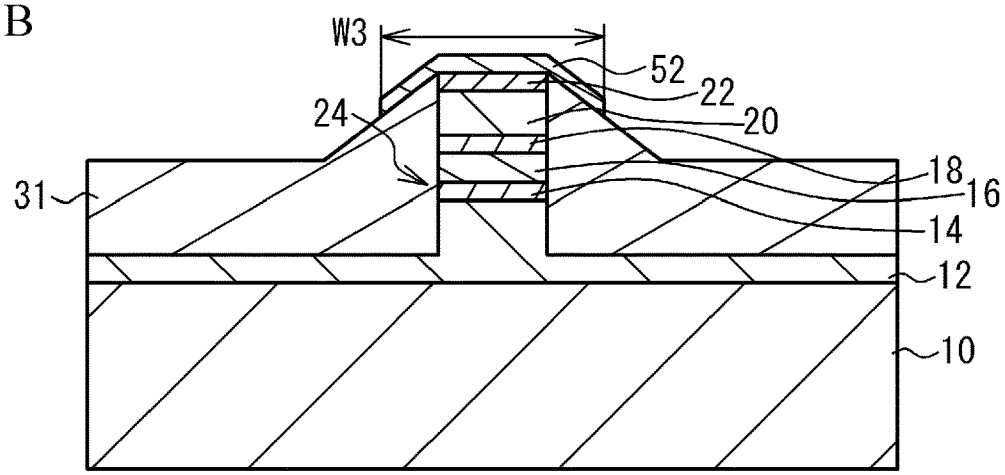
Figure 3C:
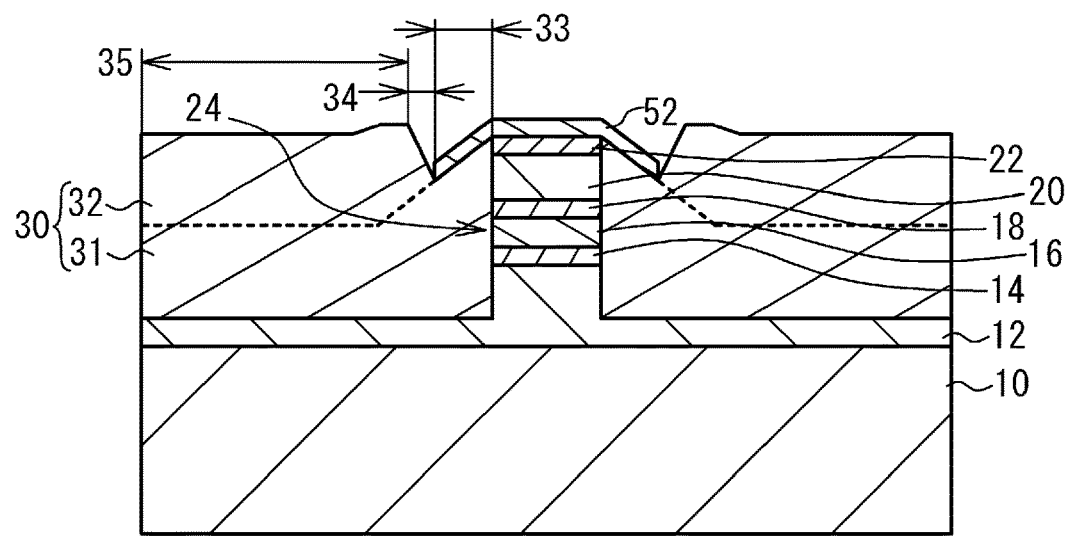

As illustrated in FIG. 3B, the mask 50 is removed, and a mask 52 is then formed. The width W3 of the mask 52 is, for example, 4.0 µm, and is greater than the width W2 of the mask 50. The mask 52 is formed of, for example, $SiO_2$, and covers the mesa 24 and a part of the buried layers 31. As illustrated in FIG. 3C, buried layers 32 (a second buried layer) are epitaxially grown by, for example, the MOCVD method. The buried layers 32 are stacked on the surfaces exposed from the mask 52 of the buried layers 31. The buried layer 31 and the buried layer 32 form the buried layer 30.

In the buried layer 30, the part on which the buried layer 32 is not stacked because covered by the mask 52 is the region 33. In the buried layer 30, the part in which the buried layer 32 is stacked such that the height of the buried layer 30 is equal to or greater than the height of the mesa 24 is the region 35. The part between the region 33 and the region 35 is the region 34. The region 34 is formed of a (111)B plane.

Figure 4A:
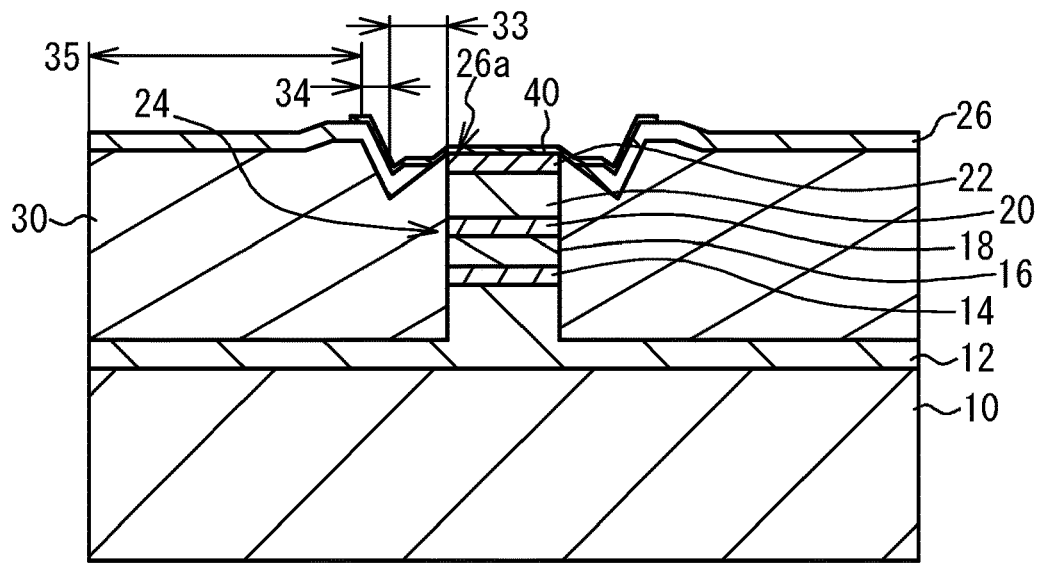
FIG. 4A to FIG. 4C are cross-sectional views illustrating the method of assembling the optical semiconductor device.

As illustrated in FIG. 4A, the insulation film 26 is formed on the buried layers 30 and the mesa 24 by, for example, the CVD method. The insulation film 26 covers the upper surface of the mesa 24 and the regions 33 to 35 of the buried layers 30. The opening 26a exposing the mesa 24 is provided in the insulation film 26 by etching or the like. The ends of the opening 26a are located in the regions 33. Thereafter, the ohmic electrode 40 is formed across the upper surface of the mesa 24 and the regions 33 to 35 of the buried layers 30 by, for example, the vacuum evaporation method, and is subjected to heat treatment to cause the ohmic electrode 40 to be in ohmic contact with the mesa 24.

Figure 4B:
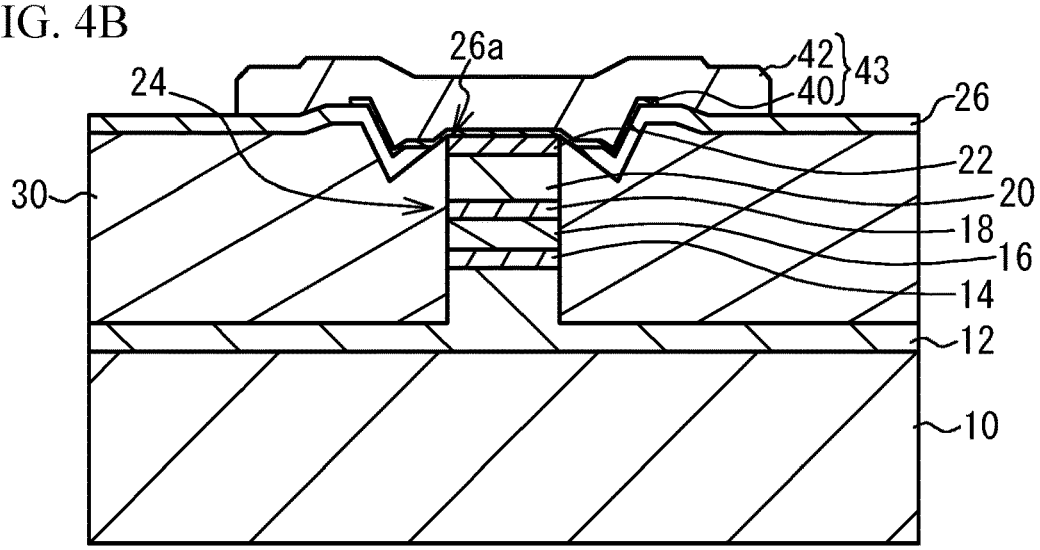
Figure 4C:
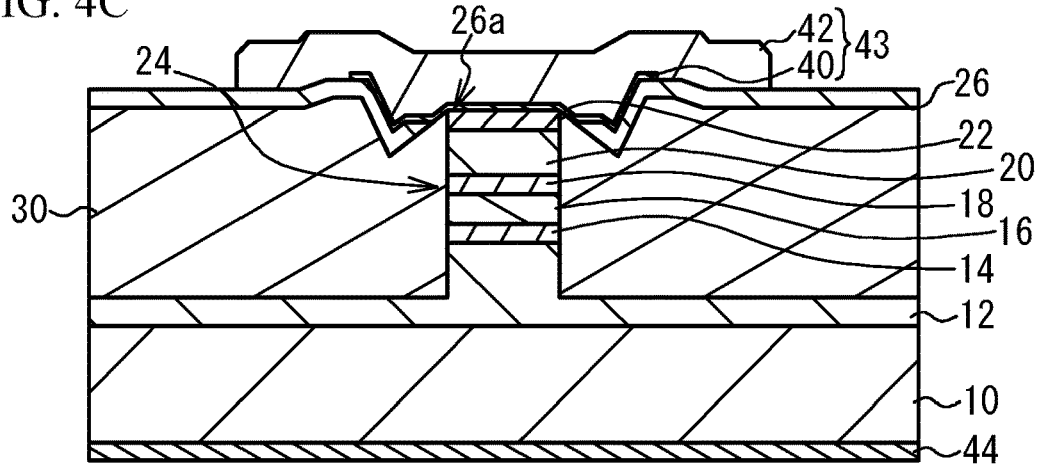

As illustrated in FIG. 4B, the wiring layer 42 is formed on the surface of the ohmic electrode 40 by, for example, plating. The wiring layer 42 has a larger width than the ohmic electrode 40, and is provided across the mesa 24 and the regions 33 to 35. As illustrated in FIG. 4C, the substrate 10 is thinned with, for example, a grinder. The electrode 44 is formed on the bottom surface of the substrate 10. Through the above processes, the optical semiconductor device 100 is assembled.

(Comparative Example)

Figure 5A:
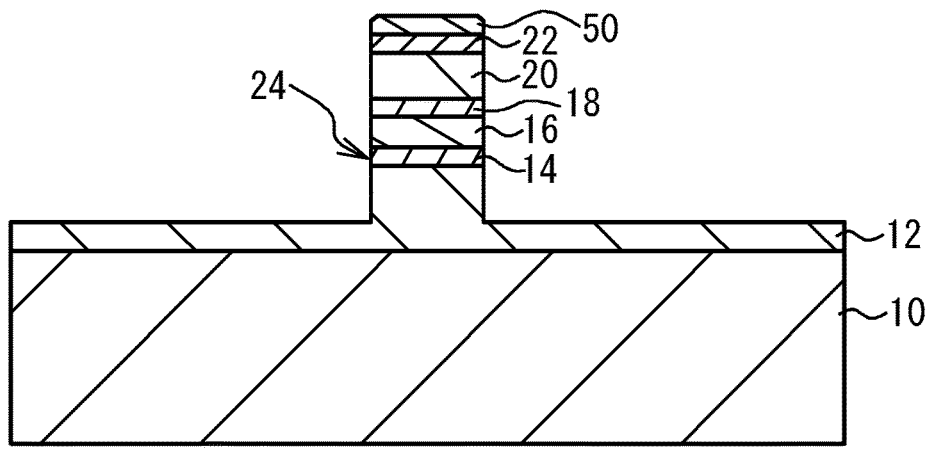
FIG. 5A to FIG. 5C are cross-sectional views illustrating a method of assembling an optical semiconductor device in accordance with a comparative example.
Figure 5B:
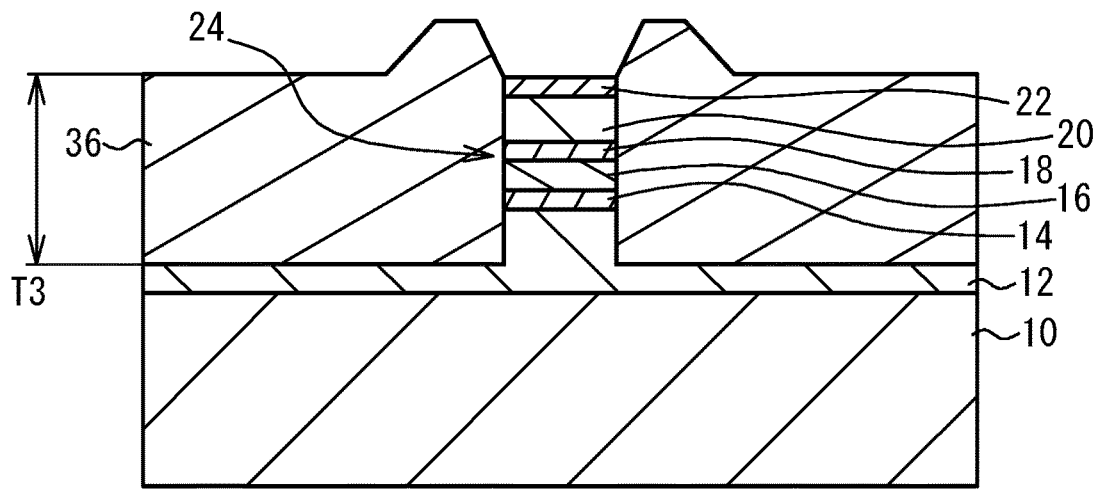
Figure 5C:
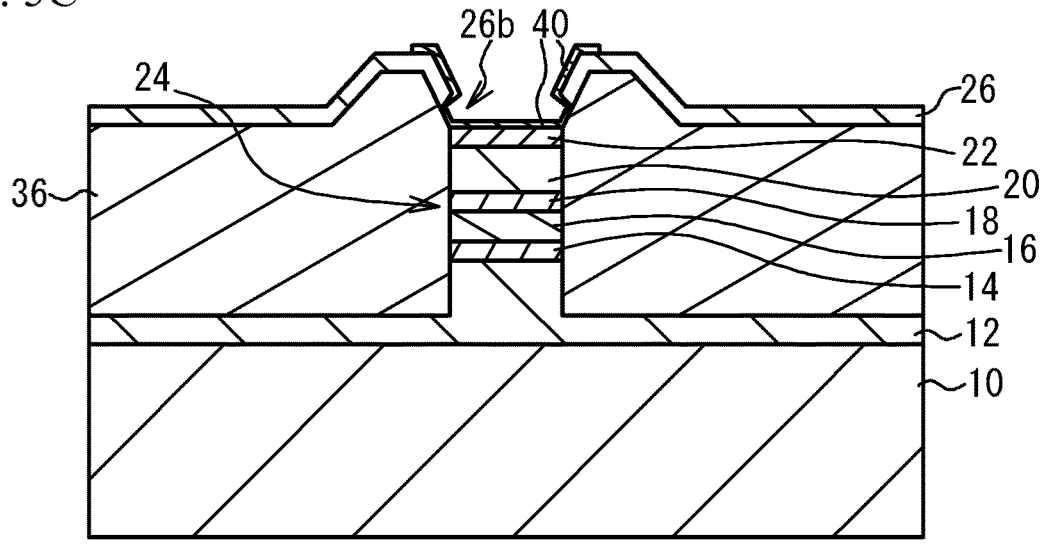

FIG. 5A to FIG. 5C are cross-sectional views illustrating a method of assembling an optical semiconductor device in accordance with a comparative example. As illustrated in FIG. 5A, the mask 50 is provided, and the mesa 24 having the same width as the mask 50 is formed. As illustrated in FIG. 5B, buried layers 36 are epitaxially grown on both sides of the mesa 24. In the first embodiment, the buried layer 30 is grown in two steps: growth of the buried layer 31 and growth of the buried layer 32. In contrast, the buried layer 36 is grown in one step. To reduce the parasitic capacitance, the buried layer 36 is made to be sufficiently thick. The thickness T3 of the part located away from the mesa 24 of the buried layer 36 is equal to or greater than the height H1 of the mesa 24, and the thickness of the part adjacent to the mesa 24 is greater than the height H1 of the mesa 24. That is, the buried layers 36 protrude above the mesa 24 at both sides of the mesa 24. The buried layer 36 has an inclined surface that heightens at farther distances from the mesa 24 in the direction to the outside.

As illustrated in FIG. 5C, the insulation film 26 is formed, and an opening 26b is provided above the mesa 24. The end of the opening 26b is located in the inclined surface of the buried layer 36. Thereafter, the ohmic electrode 40 is formed by the vacuum evaporation method or the like. Since the buried layers 36 are raised at both sides of the mesa 24, the ohmic electrode 40 becomes thin on the inclined surface of the buried layer 36. In particular, the ohmic electrode 40 becomes thin near the end of the opening 26b, and is likely to rupture.

In the first embodiment, the buried layers 30 on both sides of the mesa 24 have the regions 33 to 35, the insulation film 26 is provided on the buried layer 30, and the electrode 43 is provided on the mesa 24, the buried layer 30, and the insulation film 26. The upper surface of the region 33 adjacent to the mesa 24 is located at a height identical to or lower than that of the upper surface of the mesa 24, and lowers at farther distances from the mesa 24. The electrode 43 is less likely to be thin from the mesa 24 to the region 33, and thus, rupture is inhibited.

On the other hand, at least a part of the upper surface of the region 35 is located higher than the upper surface of the mesa 24. Since the buried layer 30 has a sufficient thickness, the parasitic capacitance is reduced. The entire of the region 35 may be thicker than the mesa 24, or a part of the region 35 may be thicker than the mesa 24 and another part of the region 35 may have approximately the same thickness as the mesa 24.

The region 34 of the buried layer 30 is located between the region 33 and the region 35, and the upper surface of the region 34 heightens at farther distances from the region 33 in the direction to the region 35. Thus, steep unevenness is less likely to be formed on the upper surface of the buried layer 30, and the unevenness on the upper surface becomes gentle. Thus, rupture of the electrode 43 is inhibited.

Specifically, as illustrated in FIG. 3A to FIG. 3C, the mask 50 is provided, the mesa 24 is formed, and the buried layers 31 are grown on both sides of the mesa 24. Thereafter, the mask 52 wider than the mask 50 is provided on the mesa 24 and the buried layers 31, and the buried layers 32 are grown on the buried layers 31. The buried layers 31 and 32 form the buried layer 30. The part covered by the mask 52 of the buried layer 31 is to be the region 33. The regions 34 and 35 are formed in the part exposed from the mask 52.

The electrode 43 extends across the mesa 24 and the regions 33 to 35. Specifically, the ohmic electrode 40 extends across the mesa 24 and the regions 33 to 35, and the wiring layer 42 covers the ohmic electrode 40. Rupture of the ohmic electrode 40, which is thinner than the wiring layer 42, is inhibited.

The insulation film 26 has the opening 26a exposing the mesa 24. When the opening 26a is made to be wide, the area of contact between the ohmic electrode 40 and the buried layers 30 becomes large. Deterioration of the buried layer 30 proceeds due to energization. Thus, the opening 26a is made to be narrow but is made to be wider than the mesa 24. In the first embodiment, the ends of the opening 26a are located in the regions 33. Thus, the width of the opening 26a is equal to or greater than the width of the mesa 24, and is equal to or less than the total width of the mesa 24 and the regions 33. Since the opening 26a can be made to be narrow, the buried layers 30 are less likely to deteriorate, and the reliability of the optical semiconductor device 100 improves. In addition, the electrode 43 is less likely to be thin in the ends of the opening 26a, and therefore, rupture of the electrode 43 is inhibited. Since the upper surface of the insulation film 26 in the region 33 is located lower than the upper surface of the mesa 24, rupture of the electrode 43 is inhibited.

To reduce the parasitic capacitance, the buried layer 30 is formed of semi-insulating InP. When the buried layers 30 are thick, the (111)B plane appears at both sides of the mesa 24, and the buried layers 30 are raised upward. The region 33 is made to be thinner than the region 35 in the buried layer 30 to inhibit the appearance of the (111)B plane. This structure makes the region 33 to be less likely to protrude above the mesa 24, and inhibits rupture of the electrode 43.

Although the embodiments of the present invention have been described in detail, it is to be understood that the various change, substitutions, and alterations could be made hereto without departing from the spirit and scope of the invention.

What is claimed is:

1. An optical semiconductor device comprising:
    a semiconductor substrate having a (100) plane orientation and being of a first conductivity type;
    a mesa that is provided on a surface in a <011> direction of the semiconductor substrate, and includes a first cladding layer of the first conductivity type, an active layer, and a second cladding layer of a second conductivity type;
    a semi-insulating buried layer that buries both sides of the mesa, is provided on the semiconductor substrate, and includes a first region and a second region that is arranged farther from the mesa than the first region, the buried layer having a surface including a surface of the first region and a surface of the second region;
    an insulation film placed in physical contact with the surface of the first region and the surface of the second region of the buried layer; and
    an electrode placed in physical contact with a surface of the mesa and the surface of the buried layer in the first region,
    wherein the surface of the first region is arranged at a height lower than a height of the surface of the mesa, and the surface of the second region is arranged at a height higher than a height of the surface of the first region.

2. The optical semiconductor device according to claim 1, wherein a thickness of the second region is greater than a thickness of the first region.

3. The optical semiconductor device according to claim 2, wherein at least a part of the surface of the buried layer in the second region is located higher than the surface of the mesa.

4. The optical semiconductor device according to claim 1, wherein the semi-insulating buried layer has a third region between the first region and the second region, and
    a surface of the third region heightens at farther distances from the first region in a direction to the second region.

5. The optical semiconductor device according to claim 1, wherein the electrode extends from the mesa to the first region and the second region.

6. The optical semiconductor device according to claim 5, wherein the electrode includes an ohmic electrode and a wiring layer provided on the ohmic electrode.

7. The optical semiconductor device according to claim 1, wherein the insulation film has an opening exposing an upper surface of the mesa, and
    wherein an end of the opening is located in the first region.

8. The optical semiconductor device according to claim 1, wherein the buried layer is formed of indium phosphorus.

* * * * *